(12) United States Patent
Yamaguchi

(10) Patent No.: US 6,727,636 B2
(45) Date of Patent: Apr. 27, 2004

(54) DISCHARGE LAMP DEVICE HAVING DISCHARGE LAMP AND CIRCUIT UNIT DIRECTLY CONNECTED TOGETHER

(75) Inventor: Hironao Yamaguchi, Gamagori (JP)

(73) Assignee: Denso Corporation (JP)

( * ) Notice: Subject to any disclaimer, the term of this patent is extended or adjusted under 35 U.S.C. 154(b) by 108 days.

(21) Appl. No.: 09/983,095

(22) Filed: Oct. 23, 2001

(65) Prior Publication Data

US 2002/0053863 A1 May 9, 2002

(30) Foreign Application Priority Data

Nov. 7, 2000 (JP) ........................................ 2000-339262

(51) Int. Cl.$^7$ ............................. F21M 3/02; H01J 1/58
(52) U.S. Cl. ............................. 313/40; 313/25; 313/27; 313/33; 362/264; 362/294; 362/373; 362/547; 439/226; 439/699.1; 439/669.2; 439/278
(58) Field of Search ......................... 439/226, 699.1, 439/699.2, 278; 315/82; 307/10.8; 313/11, 12, 20, 27, 33, 40, 45; 362/264, 294, 373, 547

(56) References Cited

U.S. PATENT DOCUMENTS

| | | | | |
|---|---|---|---|---|
| 4,733,335 A | * | 3/1988 | Serizawa et al. | ........... 362/373 |
| 5,119,275 A | | 6/1992 | Makita | |
| 2001/0014022 A1 | | 8/2001 | Frey et al. | |

FOREIGN PATENT DOCUMENTS

| | | |
|---|---|---|
| DE | 3325197 A2 | 1/1985 |
| DE | 19543852 A1 | 5/1997 |
| GB | 1602171 | 11/1981 |
| JP | 63-96803 | 4/1988 |
| JP | 10-228804 | 8/1998 |
| JP | 11-203906 | 7/1999 |

\* cited by examiner

Primary Examiner—Nimeshkumar D. Patel
Assistant Examiner—Sharlene Leurig
(74) Attorney, Agent, or Firm—Nixon & Vanderhye PC

(57) ABSTRACT

A headlight device includes a discharge lamp, a circuit unit and a heat radiating member. The circuit unit is directly connected to the discharge lamp to apply a high voltage to the discharge lamp. The heat radiating member radiates heat generated from the discharge lamp and the circuit unit. The heat radiating member is placed between the discharge lamp and the circuit unit and extends radially in a generally vertically downward direction.

22 Claims, 5 Drawing Sheets

DISCHARGE LAMP DEVICE HAVING DISCHARGE LAMP AND CIRCUIT UNIT DIRECTLY CONNECTED TOGETHER

CROSS REFERENCE TO RELATED APPLICATION

This application is based on and incorporates herein by reference Japanese Patent Application No. 2000-339262 filed on Nov. 7, 2000.

BACKGROUND OF THE INVENTION

1. Field of the Invention

The present invention relates to a discharge lamp device having a discharge lamp and a circuit unit for applying a high voltage to the discharge lamp.

2. Description of Related Art

For example, a headlight device 100 of a vehicle shown in FIG. 6 has been previously proposed as a discharge lamp device having a discharge lamp as a light source. The headlight device 100 includes a casing 101 that receives the discharge lamp 110 and a circuit unit 120 therein. The circuit unit 120 supplies a high voltage of about 20 kV to the discharge lamp 110 to light the discharge lamp 110. The discharge lamp 110 and a circuit unit 120 are electrically connected together through a high voltage wire 125.

In this arrangement where the discharge lamp 110 and the circuit unit 120 are connected together through the high voltage wire 125, the high voltage wire 125 needs to be sealed in order to prevent generation of noises from the high voltage wire 125. Furthermore, a high voltage connector 126 is required to connect the high voltage wire 125 to the discharge lamp 110. This generally causes an increase in manufacturing cost.

In view of the above disadvantages, it is conceivable to directly connect the discharge lamp to the circuit unit to make an electrical connection therebetween without using the high voltage wire. In such a case where the discharge lamp and the circuit unit are directly connected together, the high voltage connector and the high voltage wire can be advantageously eliminated.

However, if the discharge lamp and the circuit unit are directly connected together, and thereby the circuit unit is positioned adjacent to the discharge lamp, heat generated from the discharge lamp and from the circuit unit causes a rise of temperature in the circuit unit. This may cause malfunctions of circuit elements in the circuit unit.

SUMMARY OF THE INVENTION

Thus, an objective of the present invention is to provide a discharge lamp device capable of preventing a circuit unit from getting a high temperature that causes malfunctions of the circuit unit, while eliminating a high voltage wire and a high voltage connector.

To achieve the objective of the present invention, there is provided a discharge lamp device including a discharge lamp, a circuit unit and a heat radiating member. The circuit unit is directly connected to the discharge lamp to apply a high voltage to the discharge lamp. The heat radiating member radiates heat generated from the discharge lamp and the circuit unit. The heat radiating member radially extends in at least one direction from one of the following: (I) a connection between the discharge lamp and the circuit unit; and (II) the circuit unit.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

A headlight device acting as a discharge lamp device of, for example, a vehicle according to one embodiment of the present invention will be described with reference to the accompanying drawings.

Figure 1:
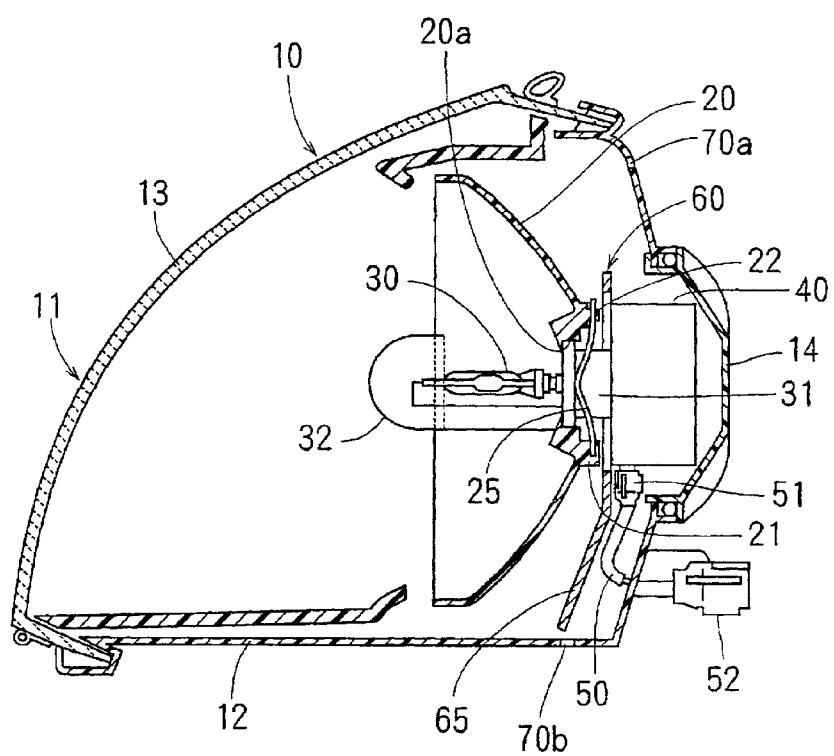
FIG. 1 is a cross-sectional view of a headlight device according to an embodiment of the present invention.
Figure 2:
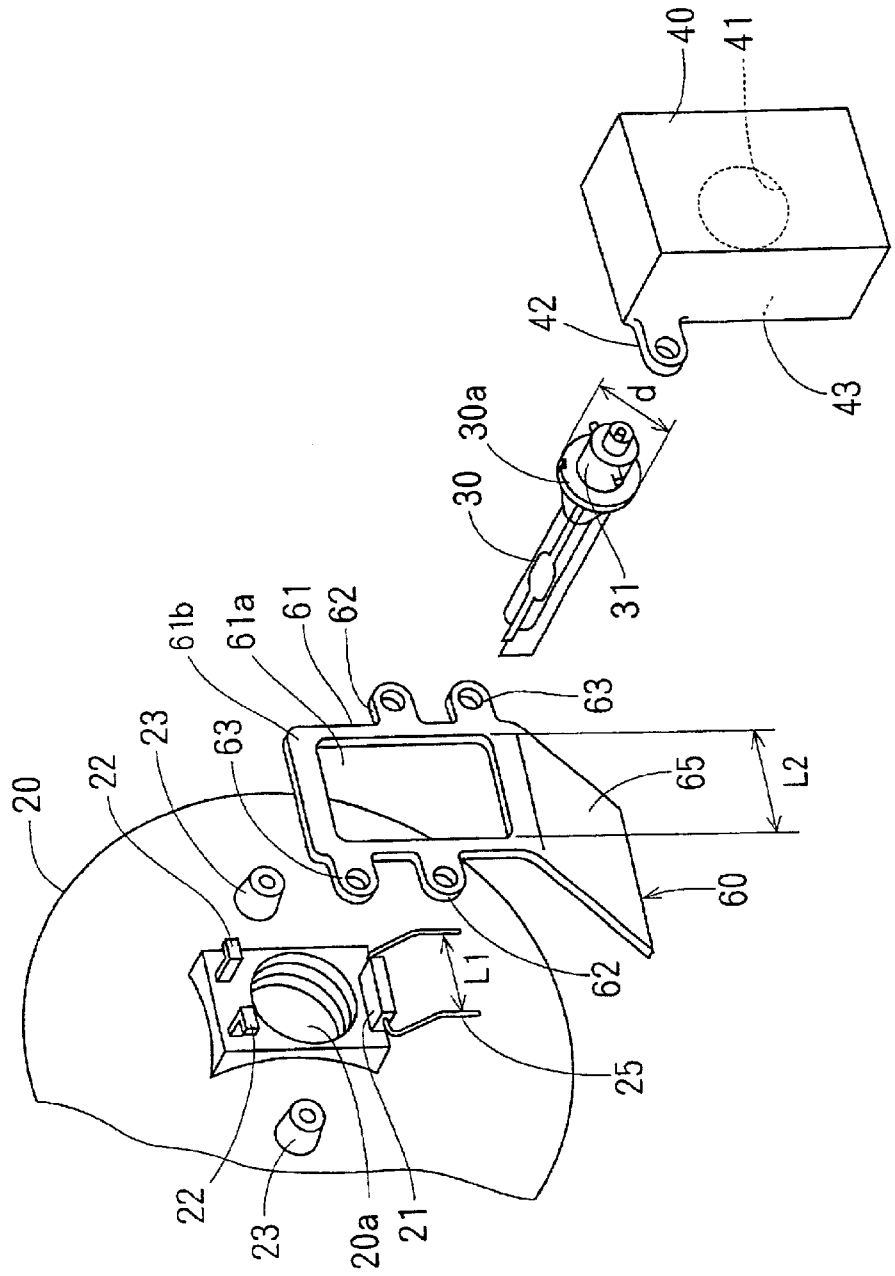
FIG. 2 is a perspective exploded view of the headlight device of the embodiment.

With reference to FIGS. 1 and 2, the headlight device 10 includes a casing 11, a reflecting member 20, a discharge lamp 30 and a circuit unit 40. The casing 11 includes a casing main body 12, a lens 13 and a cover 14.

The reflecting member 20 acting as a supporting member of the present invention is supported by the casing main body 12 through a supporting component (not shown) that has an adjustable mechanism. The reflecting member 20 is made of a resin material and has a reflecting material on its concave surface for reflecting light emitted from the discharge lamp 30.

The discharge lamp 30 includes a flange 30a having a diameter d. The flange 30a is received in a through hole 20a penetrating through the reflecting member 20. A shade 32 shades direct light emitted forwardly from the discharge lamp 30. A spring 25 is formed into a generally U-shape and is pivotably retained by a supporting portion 21 arranged outside of the through hole 20a. A distance L1 between opposed tips of the spring 25, a width L2 of a generally rectangular through hole 61a of a heat radiating section 65 of a heat radiating member 60, which will be described in greater detail below, and the diameter d of the flange 30a have the following relationship: L2>d>L1. The spring 25 urges a connector portion 31 of the discharge lamp 30 against the reflecting member 20 around the through hole 20a when the opposed tips of the spring 25 are engaged with a pair of claws 22 that are located on the opposite side of the through hole 20a with respect to the supporting portion 21.

Figure 3:
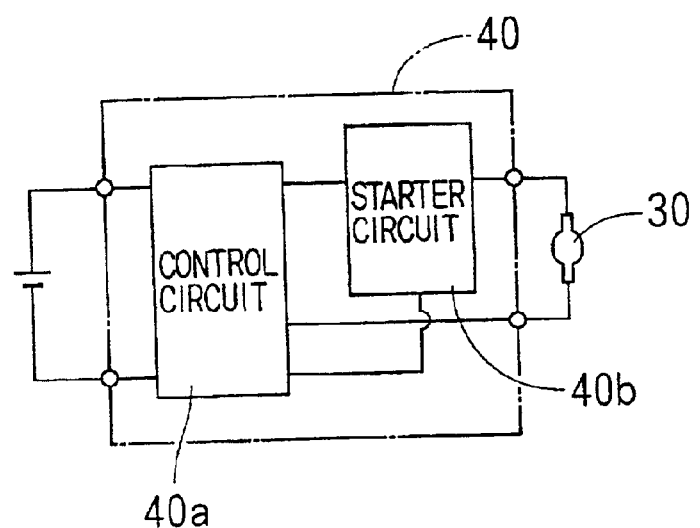
FIG. 3 is a diagram showing an arrangement of a circuit unit of the embodiment.
Figure 4:
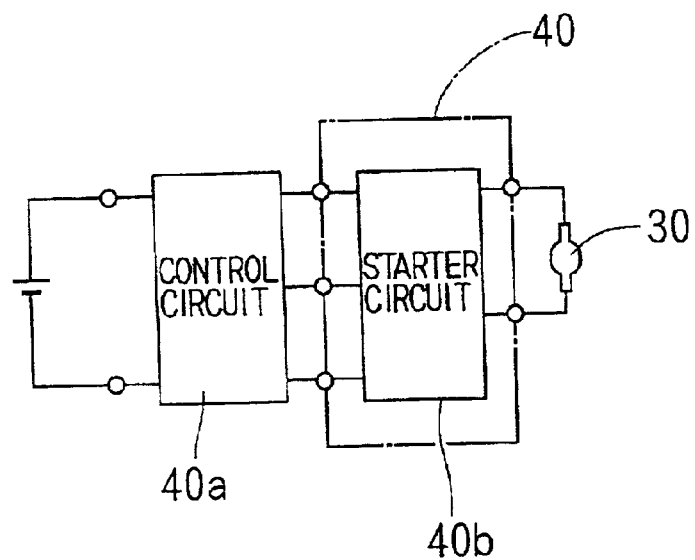
FIG. 4 is a diagram showing another arrangement of the circuit unit of the embodiment.

The circuit unit 40 has a circuit for applying a high voltage to the discharge lamp 30. As shown in FIG. 2, a connector portion 41 of the circuit unit 40 is directly and electrically connectable to the connector portion 31 of the discharge lamp 30. These connector portions 31, 41 act as the connection between the discharge lamp 30 and the circuit unit 40. The circuit unit 40 has a pair of connecting portions 42 at points corresponding to a pair of supporting portions 63 of the heat radiating member 60 to secure the circuit unit 40 to the heat radiating member 60. The connecting portions 42 of the circuit unit 40 are located in the same plane as an end surface 43 of the circuit unit 40 located on the heat radiating member 60 side thereof. The circuit unit 40 may have both a control circuit 40a and a starter circuit 40b, as shown in FIG. 3, or may have only the starter circuit 40b, as shown in FIG. 4. The starter circuit 40b is the circuit that applies the high voltage to the discharge lamp 30 when the discharge lamp 30 is lighted. The control circuit 40a is the circuit for controlling the electric power to be supplied to the discharge lamp 30. In the case where the circuit unit 40 includes only the starter circuit 40b, as show in FIG. 4, the discharge lamp and the starter circuit may be integrated into one unit.

The discharge lamp 30 and the circuit unit 40 do not contact the casing 11 and are movable with respect to the casing 11 once the discharge lamp 30 and the circuit unit 40 are assembled together, as shown in FIG. 1. Thus, an angle of an optical axis of the discharge lamp 30 can be adjusted manually or automatically by a corresponding structure (not shown) and a control operation, which is not described herein.

With reference to FIG. 1, a power supply cord 50 acting as an electrical line of the present invention supplies the battery voltage (not shown) to the circuit unit 40. The power supply cord 50 is connected to the circuit unit 40 through a connector 51 and is also connected to the battery side through a connector 52.

The heat radiating member 60 is formed into a plate shape and is made of a metal material, such as aluminum or copper having high thermal conductivity. The heat radiating member 60 is placed between the discharge lamp 30, more specifically, the connector portion 31 of the discharge lamp 30 and the circuit unit 40. As shown in FIG. 2, the heat radiating member 60 includes a securing section 61 and the heat radiating section 65. The generally rectangular through hole 61a for receiving the discharge lamp 30 penetrates through the securing section 61. The securing section 61 has a pair of connecting portions 62 to be connected to bosses 23 of the reflecting member 20, respectively. The supporting portions 63 are diagonally opposed with each other and are located in the same plane as an end surface 61b of the securing section 61 located on the circuit unit 40 side thereof. The heat radiating section 65 extends from the circuit unit 40 in a generally vertically downward direction and is shaped into a plate shape. The heat radiating section 65 can be slanted relative to the vertical, as best shown in FIG. 1.

The casing main body 12 includes a first vent hole 70a and a second vent hole 70b that are located adjacent to the upper side and the lower side of the heat radiating member 60, respectively. In the present embodiment, the second vent hole 70b is formed around a point where the casing main body 12 intersects an imaginary extension of the heat radiating section 65 which extends downwardly toward the casing main body 12.

An assembling procedure of the headlight device 10 will be described below.

(1) The spring 25 is first passed through the through hole 61a of the heat radiating member 60, and then the connecting portions 62 of the heat radiating member 60 and the corresponding bosses 23 of the reflecting member 20 are aligned with each other. Thereafter, the heat radiating member 60 is screwed to or secured to the reflecting member 20 with screws screwed into the connecting portions 62 of the heat radiating member 60 and also into the bosses 23 of the reflecting member 20.

(2) The discharge lamp 30 is inserted through both the through hole 61a of the heat radiating member 60 and the through hole 20a of the reflecting member 20. Then, the spring 25 is pivoted all the way to the claws 22 to urge the flange 30a of the discharge lamp 30 against the reflecting member 20, and the opposed tips of the spring 22 are engaged with the claws 22, respectively. In this way, the discharge lamp 30 is urged and secured against the reflecting member 20.

(3) The connector portion 31 of the discharge lamp 30 and the connector portion 41 of the circuit unit 40 are directly connected together to electrically connect between the discharge lamp 30 and the circuit unit 40.

(4) The supporting portions 63 of the heat radiating member 60 and the corresponding connecting portions 42 of the circuit unit 40 are aligned with each other, and the circuit unit 40 is screwed to or secured to the heat radiating member 60 with screws screwed into the connecting portions 42 of the circuit unit 40 and also into the supporting portions 63 of the heat radiating member 60.

(5) The cover 14 is attached to the casing main body 12.

Figure 5:
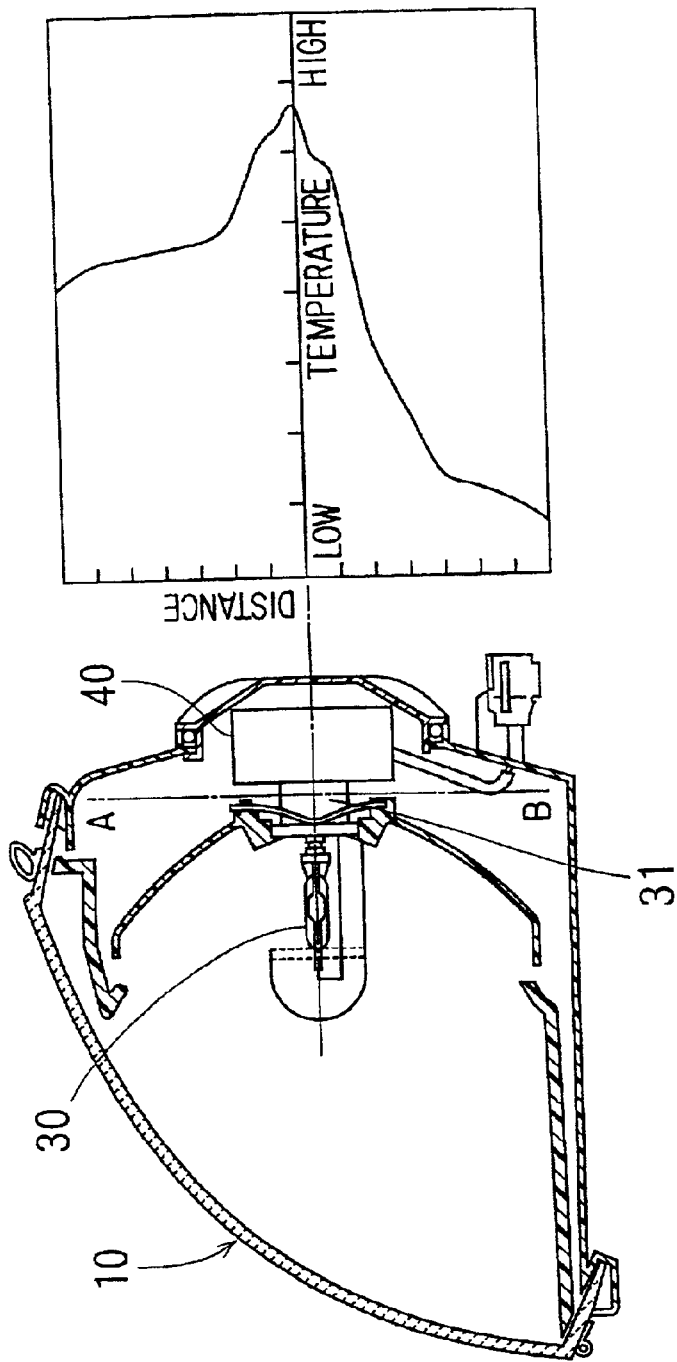
FIG. 5 is a characteristic diagram showing relationship between a distance from the circuit unit and a temperature thereat within the headlight device.
Figure 6:
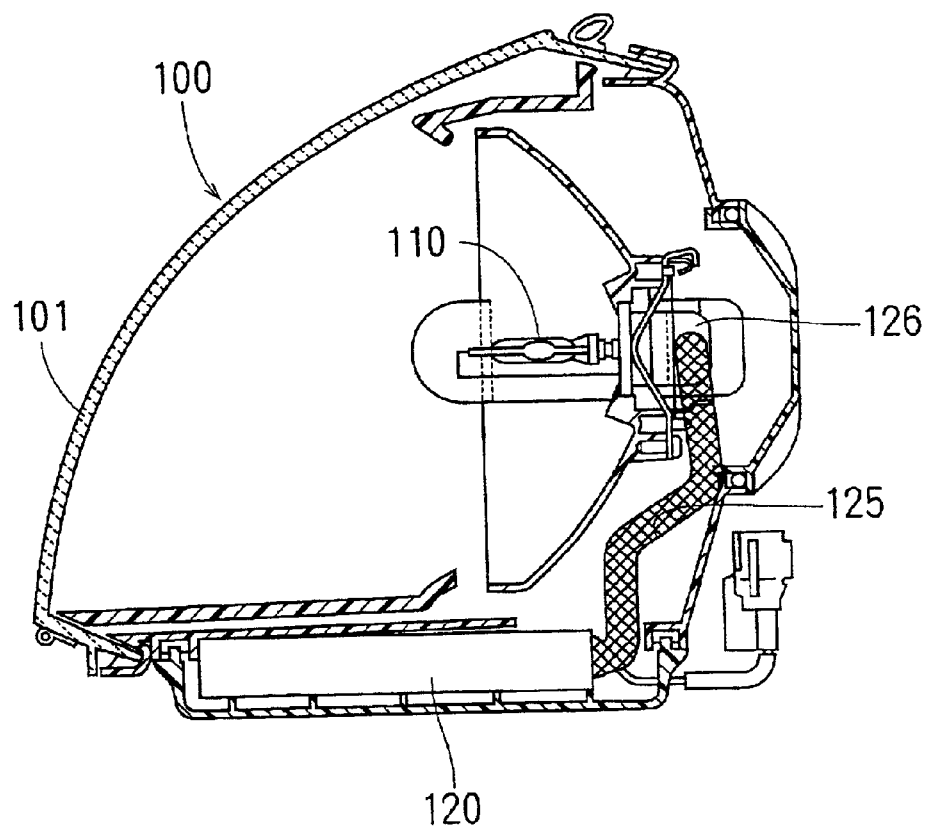
FIG. 6 is a cross sectional view of a previously proposed headlight device.

FIG. 5 shows temperature distribution in a vertical direction (the direction indicated with a line A–B in FIG. 5) around the connection between the discharge lamp 30 and the circuit unit 40 in the headlight device 10. It will be noted that in FIG. 5 the heat radiating member 60 is eliminated for clarity.

Due to heat generated from the discharge lamp 30 and from the circuit unit 40, the highest temperature is observed in the discharge lamp 30 and the circuit unit 40, and this temperature decreases in a vertically downward direction. Furthermore, the air that has flowed upwardly by convection within the headlight device 10 is cooled and then flows downwardly. Thus, the temperature drop observed along the vertically downward direction from the discharge lamp 30 and the circuit unit 40 is generally greater than the temperature drop observed along a vertically upward direction from the discharge lamp 30 and the circuit unit 40.

In the present embodiment, in view of the above characteristics of the temperature distribution within the headlight device 10, the heat radiating section 65 of the heat radiating member 60 extends in the generally vertically downward direction where the temperature is lower. The heat generated from the discharge lamp 30 and from the circuit unit 40 is conducted to the heat radiating section 65 through a path extending from the end surface 43 located on the heat radiating member 60 side of the circuit unit 40 to the heat radiating section 65 via the end surface 61b of the securing section 61 located on the circuit unit 40 side of the securing section 61. Then the heat is radiated from the heat radiating section 65 to the atmosphere where the temperature is lower. Thus, the temperature rise in the circuit unit 40 is effectively restrained, so that malfunctions of the circuit elements of the circuit unit 40 due to the high temperature are also effectively restrained.

In the present embodiment, as described above, the heat radiating member 60 has the heat radiating section 65 that extends in the generally vertically downward direction. The surrounding area around the discharge lamp 30 and the circuit unit 40 generally has the lower temperature in comparison to the discharge lamp 30 and the circuit unit 40. Thus, the temperature rise of the circuit unit 40 can be also effectively restrained as long as the heat radiating member 60 has the heat radiating section 65 that extends radially away from the discharge lamp 30 and the circuit unit 40 in at least one direction besides the generally vertically downward direction.

Furthermore, in the present embodiment, the heat radiating member 60 is screwed to the reflecting member 20 at the points that are different from the points where the circuit unit 40 is screwed to the heat radiating member 60. Here, it may be possible that the heat radiating member 60 and the circuit unit 40 are both screwed to the reflecting member 20 at the same points. However, if the heat radiating member 60 and the circuit unit 40 are both screwed to the reflecting member 20, the replacement of the discharge lamp 30 becomes a time consuming and tedious task due to the fact that when the discharge lamp 30 and the circuit unit 40 are removed from the reflecting member 20 to replace the lamp 30, the heat radiating member 60 is also removed from the reflecting member 20, requiring additional work for handling the heat radiating member 60. Furthermore, if the heat radiating member 60 and the circuit unit 40 are screwed to the reflecting member 20 that is made of a resin material having a relatively low strength, the corresponding threads of the reflecting member 20 can be worn off by tightening or loosening of the corresponding screws in the replacement work of the discharge lamp 30.

In the present embodiment, as discussed above, the heat radiating member 60 is screwed to the reflecting member 20 at the points that are different from the points where the circuit unit 40 is screwed to the heat radiating member 60. Thus, the circuit unit 40 can be removed from the casing 11 while the heat radiating member 60 is attached to the reflecting member 20. Furthermore, the discharge lamp 30 is secured to the reflecting member 20 within the through hole 61a that constitutes the unobstructed space. Thus, upon removal of the circuit unit 40, the discharge lamp 30 can be easily removed from the reflecting member 20 by pivoting the spring 25, which urges or secures the discharge lamp 30 against the reflecting member 20, in the direction away from the claws 22. As a result, the discharge lamp 30 can be easily replaced. Furthermore, since the heat radiating member 60 is made of the metal material, wearing of the threads of the heat radiating member 60 can be restrained even if the screws, which connect the circuit unit 40 and the heat radiating member 60 together, are tightened or loosened during the replacement work of the discharge lamp 30. In the present embodiment, although the circuit unit 40 is screwed to the heat radiating member 60, the circuit unit 40 can be secured to the heat radiating member 60 by snap fit or push-and-turn of the circuit unit 40 against the heat radiating member 60.

Furthermore, with reference to FIG. 1, the connection between the circuit unit 40 and the power supply cord 50 is on the circuit unit 40 side of the heat radiating member 60, so that the heat radiating member 60 does not interfere removal of the power supply cord 50 from the circuit unit 40. Also, the warm air that has been heated is vented through the first vent hole 70a by the convection within the headlight device 10, and the outer air flows into the inside of the headlight device 10 through the second vent hole 70b to replace the vented air. Thus, the outer air flowed into the inside of the headlight device 10 can cool the heat radiating member 60, allowing further heat dissipation by the heat radiating member 60. The outer air introduced into the inside of the headlight device 10 through the second vent hole 70b flows along the surface of the heat radiating section 65, so that the outer air can contact the heat radiating section 65 much longer, and thereby the cooling performance of the heat radiating member 60 is further improved.

In the present embodiment, although the heat radiating member 60 is placed between the discharge lamp 30 and the circuit unit 40, the heat radiating member can be placed along an outer peripheral surface of the circuit unit 40 or can be provided to the circuit unit 40 on the side opposite to the discharge lamp 30. Furthermore, in the present embodiment, the heat radiating member 60 contacts the circuit unit 40 to remove the heat from the circuit unit 40 to the heat radiating member 60 through the contacted portion between the heat radiating member 60 and the circuit unit 40. However, the heat radiating member can contact the connector portion (connection) 31 of the discharge lamp 30 to remove the heat therethrough.

Furthermore, the circuit unit 40 can contact a portion of the metal casing 11 of the headlight device 10 to remove the heat therethrough.

Additional advantages and modifications will readily occur to those skilled in the art. The invention in its broader terms is therefore, not limited to the specific details, representative apparatus, and illustrative examples shown and described.

What is claimed is:

1. A discharge lamp device comprising:
   a discharge lamp;
   a circuit unit directly contacting a connecting portion of said discharge lamp, so as to be directly connected to said discharge lamp in the absence of a wire, to apply a high voltage to said discharge lamp; and
   a heat radiating member for radiating heat generated from said discharge lamp and said circuit unit, said heat radiating member extending in at least one direction radially away from one of the following:
      (I) a connection between said discharge lamp and said circuit unit; and
      (II) said circuit unit; and
   a reflecting member arranged behind said discharge lamp to reflect light emitted from said discharge lamp, wherein a portion of said heat radiating member extends radially beyond a space defined between said circuit unit and said reflecting member.

2. A discharge lamp device according to claim 1, wherein said heat radiating member extends in a generally vertically downward direction.

3. A discharge lamp device according to claim 1, wherein said reflecting member supports said heat radiating member, and said circuit unit is secured to said heat radiating member.

4. A discharge lamp device according to claim 1, wherein said heat radiating member is placed between said discharge lamp and a connection between said circuit unit and an electrical line that supplies a power source voltage to said circuit unit.

5. A discharge lamp device according to claim 1, further comprising a casing that receives said discharge lamp, said heat radiating member and said circuit unit, wherein said discharge lamp, said circuit unit and said heat radiating member do not contact said casing and are movable with respect to said casing.

6. A discharge lamp device according to claim 5, wherein said casing includes:
   a first vent hole placed above said heat radiating member; and
   a second vent hole placed below said heat radiating member.

7. A discharge lamp device according to claim 1, further comprising a casing that receives said discharge lamp, said heat radiating member and said circuit unit, said casing including:
   a first vent hole placed above said heat radiating member; and
   a second vent hole placed below said heat radiating member.

8. A discharge lamp device according to claim 6, wherein said second vent hole is located around a point where said casing intersects with an imaginary extension of said heat radiating member that extends toward said casing.

9. A discharge lamp device according to claim 1, wherein said heat radiating member is made of a material selected from a group consisting of copper and aluminum.

10. A discharge lamp device according to claim 6, wherein at least a portion of said heat radiating member located adjacent to said second vent hole is slanted relative to the vertical.

11. A discharge lamp device according to claim 1, wherein said heat radiating member extends radially beyond both said circuit unit and said reflecting member.

12. A discharge lamp device according to claim 1, wherein a downward extent of said heat radiating member from said circuit unit is greater than an upward extent of said heat radiating member from said circuit unit.

13. A discharge lamp device according to claim 1, wherein there is a single heat radiating member.

14. A discharge lamp device according to claim 1, wherein at least a portion of said heat radiating member is slanted relative to vertical.

15. A discharge lamp device according to claim 1, wherein the heat radiating member includes a securing section and a heat radiating section and wherein said securing section includes a hole for receiving the discharge lamp.

16. A discharge lamp device according to claim 15, wherein the securing section further includes connecting portion connected to the reflecting member and supporting portions secured to the circuit unit.

17. A discharge lamp device according to claim 16, wherein the supporting portions are secured to the circuit unit with screws.

18. A discharge lamp device according to claim 16, wherein the connecting portions are connected to the reflecting member with screws.

19. A discharge lamp device according to claim 16, wherein the securing portions are offset from the connecting portions.

20. A discharge lamp device according to claim 1, wherein the heat radiating member is made of a metal material.

21. A discharge lamp device according to claim 1, wherein said connecting portion is non-detachably secured to said discharge lamp.

22. A discharge lamp device according to claim 1, wherein said connection portion is a single, integral connecting portion of said discharge lamp, which directly contacts the circuit unit.

* * * * *